(12) United States Patent
Boomer et al.

(10) Patent No.: US 7,760,115 B2
(45) Date of Patent: Jul. 20, 2010

(54) LOW POWER SERDES ARCHITECTURE USING SERIAL I/O BURST GATING

(75) Inventors: James B. Boomer, Monument, CO (US); Michael L. Fowler, Scarborough, ME (US); Steven Mark Macaluso, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/909,123

(22) PCT Filed: Sep. 4, 2007

(86) PCT No.: PCT/US2007/019269
§ 371 (c)(1),
(2), (4) Date: Sep. 19, 2007

(87) PCT Pub. No.: WO2008/027586
PCT Pub. Date: Mar. 6, 2008

(65) Prior Publication Data
US 2009/0231171 A1    Sep. 17, 2009

Related U.S. Application Data

(60) Provisional application No. 60/824,351, filed on Sep. 1, 2006.

(51) Int. Cl.
*H03M 9/00* (2006.01)
(52) U.S. Cl. .................................. 341/100; 370/357
(58) Field of Classification Search ................ 341/100, 341/101; 370/357, 100.1, 105.1; 375/347; 455/41, 52.1
See application file for complete search history.

(56) References Cited

U.S. PATENT DOCUMENTS 6,353,338 B1    3/2002    Fiedler et al.

(Continued)

FOREIGN PATENT DOCUMENTS

WO    WO 2005/055540 A2    6/2005

(Continued)

OTHER PUBLICATIONS

PCT Notification of Transmittal of the International Search Report and the Written Opinion of the International Searching Authority, or the Declaration for International Application No. PCT/US2007/019269. Mailed by European Patent Office on May 16, 2008, 13 pages.

(Continued)

*Primary Examiner*—Rexford N Barnie
*Assistant Examiner*—Joseph Lauture
(74) *Attorney, Agent, or Firm*—Cesari and McKenna, LLP; Edwin H. Paul, Esq.

(57) ABSTRACT

A serializer/deserializer is disclosed with a flexible design that allows for sending data streams between computer systems where the power dissipation is markedly reduced by placing the serializer/deserializer in a standby, low power mode between the sending of data. Word data bits are framed and sent along with clock pulses that define when the bits may be reliably received. High speed, typically, CML logic is used for the transmission line drivers and together with the clock pulse, a data word is sent faster than the computer system can send the next word to the serializer/deserializer. The disclosure frames the word and detects the word end, whereupon the system is placed into the standby mode. In addition the serializer/deserializers may be placed in a master/slave arrangement where the slave can be arranged to use the master's clock to send word data bits back to the master.

25 Claims, 8 Drawing Sheets

U.S. PATENT DOCUMENTS

2006/0256781 A1* 11/2006 Lewis .................. 370/357

FOREIGN PATENT DOCUMENTS

WO  WO 2005/091543 A1  9/2005

OTHER PUBLICATIONS

"FIN24AC mySerdes 22Bit Bi-directional Serializer/Deserializer" Datasheet. Dated Dec. 1, 2005. pp. 1-21. Retrieved from http://www.datasheet.in/datasheet-html/F/I/N/FIN24AC_FairchildSemiconductor.pdf.html. All pages.

* cited by examiner

LOW POWER SERDES ARCHITECTURE USING SERIAL I/O BURST GATING

This application is related to and claims priority from our co-pending PCT application of common title, inventors, and ownership, Serial No. PCT/US07/19269, timely filed on Sep. 4, 2007, and which PCT application is incorporated herein by reference.

This application also claims priority, via the above PCT application, from our provisional application of common title, inventors and ownership, Ser. No. 60/824,351, filed on Sep. 1, 2006, and which provisional application is incorporated herein by reference.

BACKGROUND OF THE INVENTION

The present invention relates to serial data transmitting and receiving, SerDes, and, more particularly, to SerDes where power dissipation is important.

BACKGROUND INFORMATION

Figure 1:
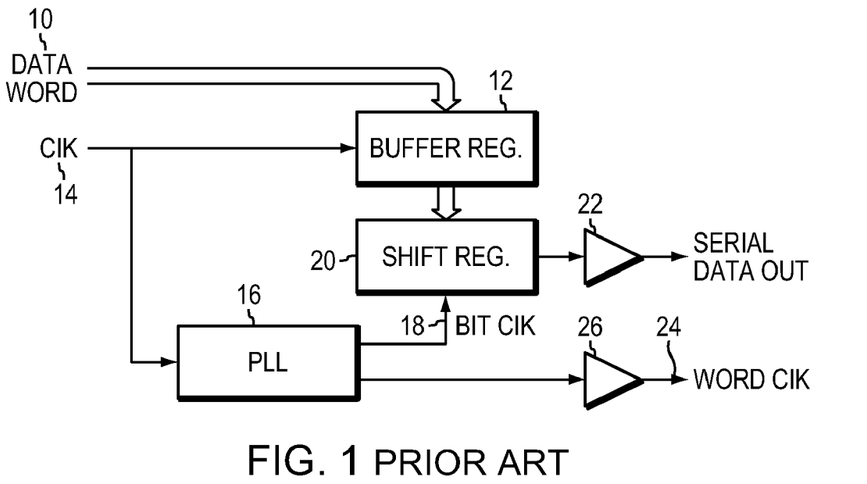
FIGS. 1 and 2 are block diagram schematics of a prior art serializer and deserializer.

FIG. 1 illustrates a known serializer in a block schematic form. A parallel data word 10 is loaded into a buffer register 12 with a clock 14. The clock 14 is also fed to a phase locked loop (PLL) or a delay locked loop (DLL) 16, hereinafter PLL will be used to refer to both the PLL and DLL. The PLL generates a bit clock 18 that loads the shift register 20 and subsequently shifts out the data in the shift register 20 serially bit by bit through a cable or transmission line driver 22. The bit clock 18 that shifts the data out bit by bit stays synchronized to the bit positions within the word by the PLL. Along with the serial bits from driver 22 a word clock 24 is output via driver 26. The receiver will be able to distinguish the beginning and ending of the serial data stream by referencing the bit stream via the word clock. Often there is a start bit and a stop bit that surround or frame the eight data bits.

Figure 2:
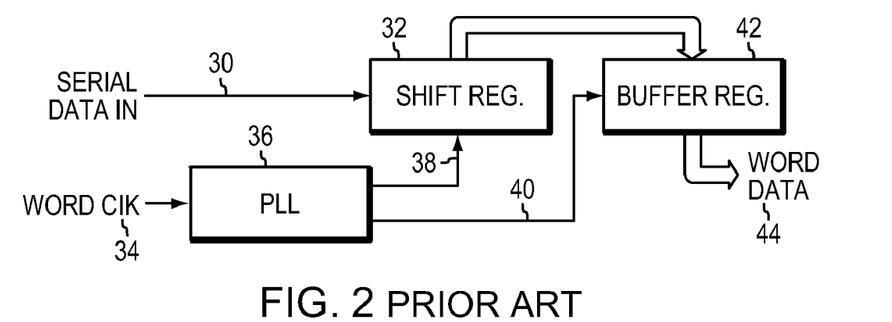

FIG. 2 shows a receiver circuit that de-serializes the bits to form words. The serial data 30 is input to a shift register 32. The word clock 34 is input to a PLL 36 that generates a bit clock 38 that is synchronized to the bit location in a word by the PLL. With this synchronization, the bit clock 38 properly loads the bit stream into the shift register 32. When the word has been received by the shift register 32 (as determined from the word clock), the PLL outputs a clock 40 that loads the parallel data in the shift register 32 into a buffer register 42. The word data 44 is in parallel form ready for use in the receiving system.

FIGS. 1 and 2 contain buffer registers (12, 42) that holds the word to be sent or the word just received. The buffer allows nearly the entire time for the next word to be sent or received before the last word is removed from the buffer registers. The shift registers (20, 32) can be loaded and data shifting in or out while the buffer holds the next or the prior word. The logic and the timing to accomplish these tasks are well known. However, if buffer registers are not used, then the word to be sent and the word received must be removed during a bit time. Again, such designs are well known in the art.

Figure 3:
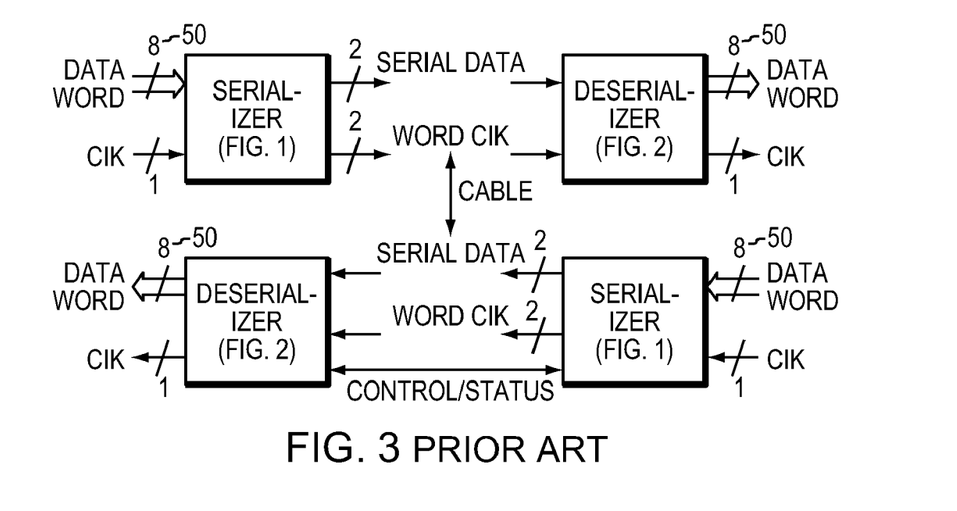
FIG. 3 is a system block diagram of a prior art duplex system.

FIG. 3 shows a complete bidirectional system using serializers as in FIG. 1 and deserializers as in FIG. 2. Note that there are eight data lines and a single clock 50 into each serializer and out from each deserializer. The data and clock lines between the serializer and the deserializer are typically differential signals each using two conductors transmission lines.

The serializer/deserializer of FIG. 3 each contain a PLL that are common in such devices, but PLL's consume significant power, are complex, require long locking times, and occupy considerable chip real estate. It would be advantageous to dispense with PLL's especially when no data is being sent and/or received.

Figure 4:
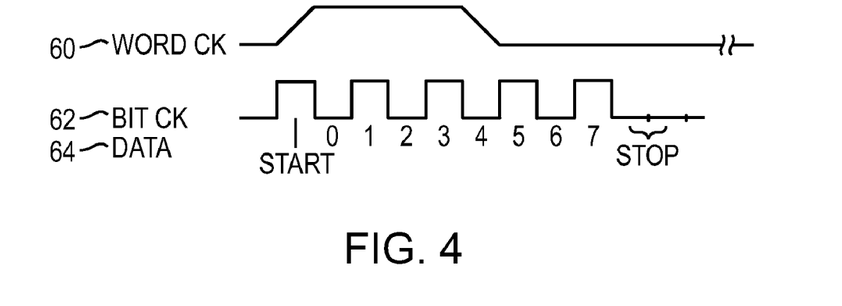
FIG. 4 is a representative prior art timing chart.

FIG. 4 is a timing diagram that shows a generic timing chart that illustrates the serial sending of a framed eight bit data word 64. A word clock 60 is fed to a PLL that generates a synchronous bit clock 62. The word clock 60 must occur often enough for the PLL to remain locked. The data bits are loaded into a shift register using a word clock edge. Then the data bits in the shift register are shifted out serially by the bit clock 62. In FIG. 4 an eight bit word, framed by a start and a stop bit, is shifted out on the rising and falling edges of the bit clock 62.

A similar operation applies to the receiving of the serial data. In this case, the word clock is received and applied to a PLL that generates a synchronous (to the word clock) bit clock that is used to load the data bits into a receiving shift register. Data bits must be stable when the clocks cause the data bits to be sent and to be received. Time delays are designed into such systems to accomplish this, as known in the art. In the case where words are sent out synchronously, the first bit (e.g., least significant) of the next word is sent out directly after the last bit (e.g., most significant) of the prior word. In contrast the above description of asynchronous transfer employs bits or indicators (e.g., a start and stop bit) that frame the data bits. In both the synchronous and asynchronous cases, system means must be employed, as are well known in the art, to prepare the sender and the receiver to properly send and receive the data. Also, systems are arranged to send data alternately then to receive data; while other systems can send and receive simultaneously. The former is referred to as half duplex and the latter as duplex. Again, system designers understand the limitations and requirements of such systems to properly send and receive data.

It is axiomatic that the receiving system must be able to distinguish data word boundaries from a stream of serial bits, as discussed above.

In general, transferring serial data offers an advantage in that the cable running between the sending and receiving systems need only have a few signals (if differential signals, one data pair and one clock pair) carrying wires (and, of course, if single ended a return wire or wires). In contrast, sending data over cables in parallel requires line drivers for each bit in a word and a clock driver. These parallel drivers consume high power and output high currents that create significant system noise.

In applications where cables or transmission lines are not used, but where parallel data is sent between integrated circuit packages, many pins on those packages must be set aside for each bit of the parallel data. In the newer designs, using sixty-four and one hundred and twenty-eight bits, the pins available on the packages become a design limitation. Larger packages, ball grid arrays, and similar packages that provide pins over the entire bottom surface of a package address this problem. However, the problem persists. Applications that may suffer from these limitations include virtually all computing systems with complex displays, e.g. cell phones, desktop and lap top computers, electronic games, computing systems with off-chip memory, any computing system addressing bulk memory, and electronic instrumentation, monitoring and controlling equipment.

Figure 5:
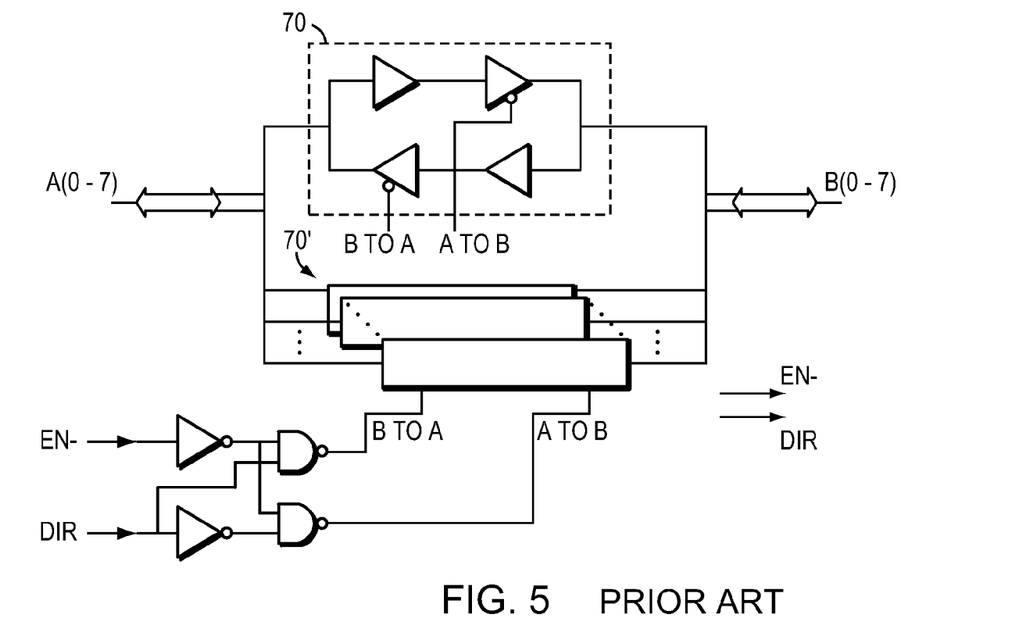
FIG. 5 is a block diagram schematic of a prior art directional buffer.
Figure 6:
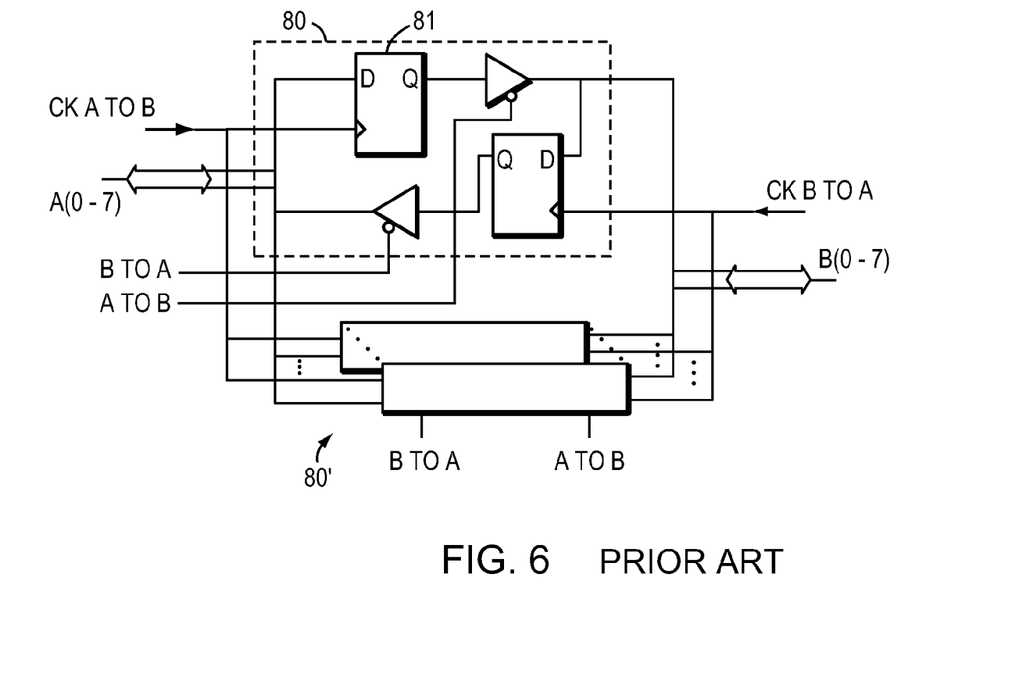
FIG. 6 is a block diagram schematic of a prior art directional buffer incorporating a storage register.

FIGS. 5 and 6 are illustrations of buffer circuits that may use logic level translators between the various different voltages used by different logic families, for example, TTL, low level TTL, CMOS, and CML (current mode logic) logic families.

FIG. 5 shows bidirectional buffers 70 that connect the A(0-7) signals to the B(0-7) signals when the A to B signal is high. The signals travel the opposite direction when the B to A signal is high. A single bidirectional buffer circuit is shown in 70 and, in this instance of eight bits, the parallel buffers for the other seven bits are indicated by 70'. Prior art replacement of these buffer style circuits with serializers suffers from the power dissipation and complexity of the PLLs, the need for a reference clock, the lock time of the PLL, and the chip real estate occupied. In FIGS. 5 and 6 as shown, the A to B and B to A signals are low true. The DIR and EN-signals control the direction. In this case, the EN- must be low to allow the DIR signal to determine the data flow direction. If EN- is high, both the B to A and A to B are high and the A and B signals are isolated from each other.

FIG. 6 shows a buffer-type circuit where the eight data bits A(0-7) are clocked into the D-type flops, one bit shown as 80. The CK A to B would load A0 into the flop 81. The A0 data is output as Q flop signal and then to the B0 line when A to B is high. Similar action occurs from sending B0 to the A0 line when B to A is high. The circuitry for the other seven bits is indicated by 80'.

It would be advantageous to send and receive serial data with less power dissipation compared to the prior art. This is especially true where mobile applications where power is supplied by batteries.

It would be advantageous to send and receive data simultaneously at the same frequency

SUMMARY OF THE INVENTION

The present invention provides a serializer/deserializer that sends or receives a serial data signal and a corresponding clock that may be used to identify each bit. Typically these signals are carried on two differential transmission lines (four lines in total) where the data and bits clock lines are functionally connected to an identical serializer/deserializer. The data transmission may be bi-directional with respect to the serializer/deserializer.

For example, parallel data words may be transferred to the serializer/deserializer from a computing system where the data word is serialized and framed. An I/O driver is enabled and the word sent over, preferably, as a differential signal on two conductors of a transmission line. A corresponding clock, synchronized to the data bits, is sent over as a differential signal on another pair of conductors. A receiver may use the clock to reliably clock in the data bits as they arrive.

The corresponding clock may be a bit clock that operates at a higher frequency (a burst mode) than needed by the sending system. Between the sending of words, the I/O drivers may be placed in a low power standby mode. The I/O drivers dissipate quite a bit of power to drive the transmission lines (compared to the logic circuitry). Placing them in the standby mode significantly reduces the power dissipation of the drivers and the sending system.

As suggested above, sending the word in a burst (or burst mode) requires that the word boundaries be detected by the receiving system. Typically a start signal and a stop signal frame a data word being sent. The form of the start and stop may include one or more bits, or a combination of bits or a logical combination of signals on the clock line and the data line.

The present invention provides for sending a data word as a burst of serial data at a higher clock rate than required by the sending system. This allows a reduction of power between sending words. However, illustratively the I/O circuitry that drives the transmission lines must be fast enough to accommodate the bit rates sent over the transmission lines. Illustratively, CML (current mode logic) may be used since switching currents rather than voltages often lead to much faster circuitry.

In one application the present invention provides for a master/slave configuration. Here the master sends control information to the slave. For example the master may program the slave to send data from a system connected to the slave. The slave will fetch the data and serialize and send it to the master. In one embodiment, the master may send its clock to the slave and program the slave to use that clock to send the data back to the master. In this way the received data bits arrive at the same frequency as the master clock.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 7A:
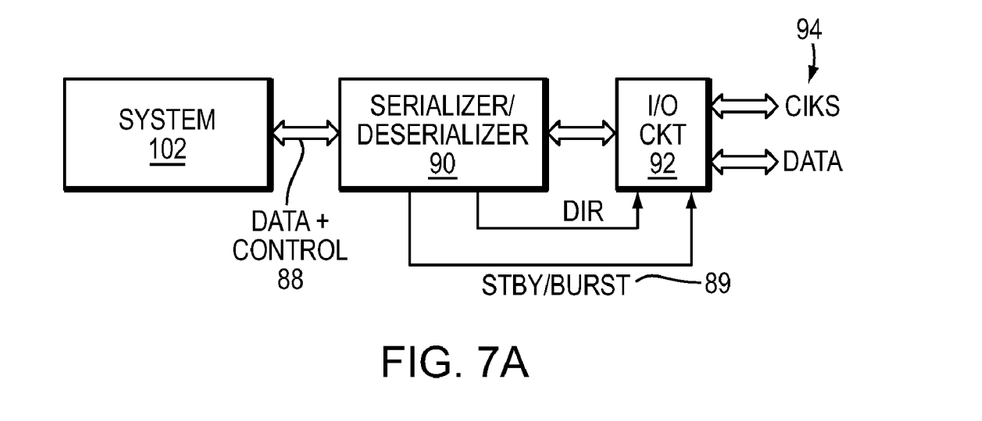
FIG. 7 is a schematic of a block diagram of a system embodying the invention.
Figure 7B:
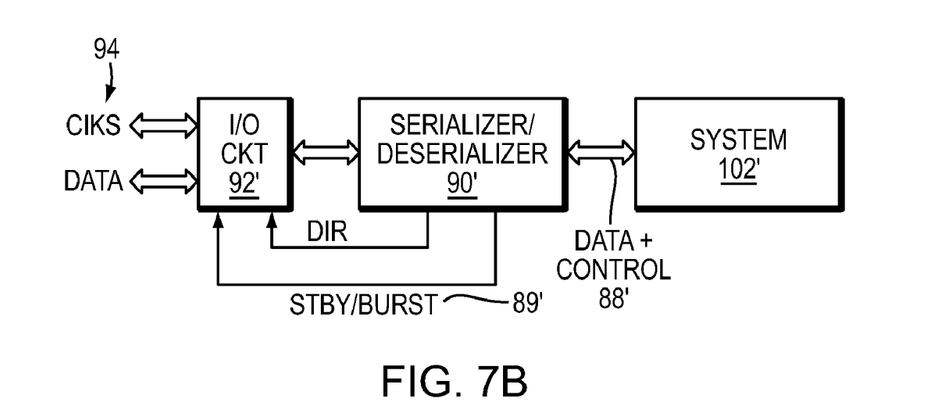

FIGS. 7A and 7B are block diagrams of a typical serializer/deserializer system. A computer system 102 sends and receives data from a similar system 102'. The system 102 transfers parallel data and control 88 to the serializer/deserializer 90. If sending, the serializer/deserializer 90 serializes the data and directs 89 the I/O CKT (circuit) 92 to come off standby and send the serial data and a clock signal over the transmission cable 94 to an I/O 92' receiver. The corresponding receiver serializer/deserializer 90' deserializes the received data using the received clock and transfers the parallel data to the system 102'.

Figure 8:
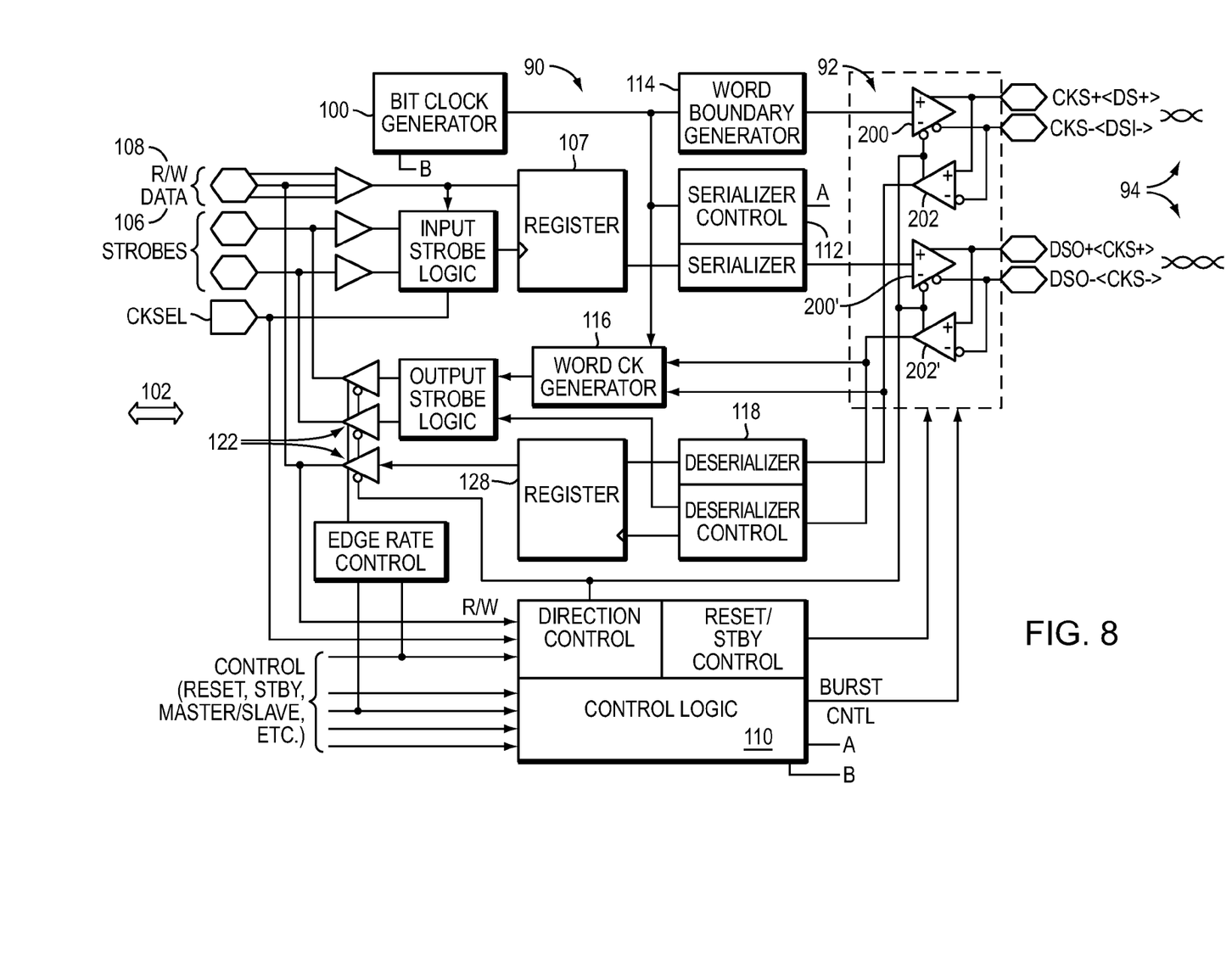
FIG. 8 is a schematic/block diagram of a serializer/deserializer illustrating the present invention.

FIG. 8 is a schematic block diagram illustrating the operating functions in the serializer/deserializer 90, and the I/O circuitry driving two twisted pair transmission lines 94. The logic design, logic families or microprocessors that may be used to implement the functions of 90 are well known to those skilled in the art.

In FIG. 8, when sending, the serializer/deserializer 90 employs an oscillator as a bit clock generator 100 for dual use for a serializer control 112 and generating a word boundary 114. The bit clock generator 100 is designed at a frequency that is higher data rate than that required by the sending system 102. For example, if eighteen bits are being sent for each word and the sending system 102 outputs a new word to be sent every microsecond (one megaHertz frequency), the bit clock frequency may be set at least to eighteen megaHertz or eighteen pulses per microsecond. This allows a word to be sent before the next is loaded. In practice the bit clock generator may be set at a much higher frequency, that frequency limited by the logic design and circuitry and the transmission cable characteristics. An advantage of the higher frequency is that the I/O CKT may be placed into a standby condition, where very little power is being dissipated, between the sending of the data words.

Still referencing FIG. 8, the system 102 interacts with the serializer/deserializer 90 with bidirectional data lines 108, an R/W (read/write) line 108, and strobes 110 that load the parallel data when sending and indicate the receipt of a parallel word when receiving. In addition other control lines may be used, e.g., to set the direction of data flow, to command the standby mode, to reset the system, etc. Item 90 interacts with the I/O drivers 92 using a direction signal, a burst or standby control, a reset signal, serial data and clock in and serial data and clock out signals.

When the system 102 sends a word, parallel data and timing lines 106 generated by the system 102 loads the word data bits into the register 107. The control logic 110 may be turned on by a control signal B. Item 90 is conditioned to send or output the word. The serializer control and serializer itself may be enabled by the signal A from the Control Logic 110. The bit clock generator 100 takes the output from the register and serializes it 112 while generating a word boundary 114. The bit clock generator is preferably a ring oscillator (an odd number of inverters in series fed back upon itself) that is connected when the last metallization is deposited or fused to yield the fastest clock consistent with the applications contemplated. The I/O 92, conditioned by the control logic 110 and the word boundary generator, outputs the word boundaries and the serial data word framed by the word boundaries and corresponding CK signals over the transmission lines 94.

When the system 90 receives a word from the transmission lines 94, a received word boundary edge, data bits and bit clocks are received and input to a word clock generator 116. The receipt of the clock and the data signals allows the flexibility of the word boundaries to be designed using one or both data and clock signals in combination. The received data word is deserialized 118 and loaded into a holding register 120 that can be read by the system 102 via the control logic 110. In detail, when a word is resident in the receiving holding register 120, a signal is presented to the system 102 on a strobe line indicating a word is ready to be received into the system 102. The system 102 via control lines reads the register by enabling the appropriate gates 122.

With respect to word boundaries, an example may include an edge to indicate a word is being loaded from a computer in parallel. That edge is detected and the I/O is powered up and the word sent serially. The I/O and possibly the serializer (not shown) are powered down when the end or frame of the word is detected. The end of the word may be an added bit or two or an edge or a combination of clock pulses or lack of clock pulses along with an edge transition on the data lines—many other techniques are known in the art for framing words.

Figure 9A:
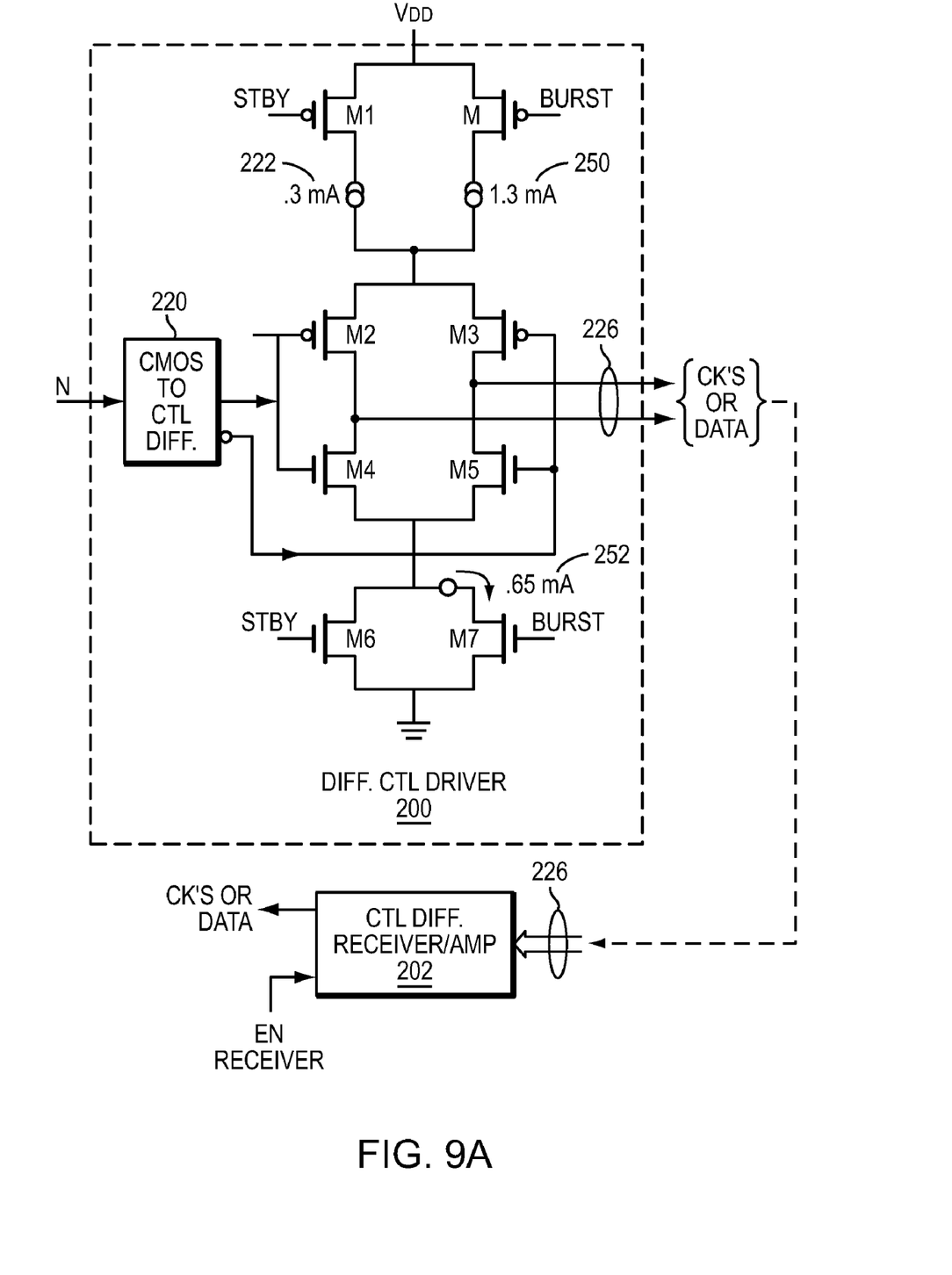
FIGS. 9A and 9B are schematics of an embodiment of a current mode logic circuits used as an I/O transmission line driver and receiver, respectively.

FIG. 9A illustrates CML circuitry driving transmission lines 94. The system is designed with CML (current mode logic) which switches currents rather than voltages for higher speed. CML by enabling more current to be switched quickly changes from a standby (low power) condition between words to a full powered condition for sending the next word. Again, since the inventive serializer/deserializer system sends out words faster than the system sends words to be sent the present invention permits saving power by entering a standby or low power mode between sending data words. Although CML logic is illustrated, low voltage logic (LVDS) or other logic families may be used as will be known to these skilled in the art.

FIG. 9A illustrates a CML driver that may be used for one differential pair—either data or clock pair of transmission line 94. In the standby mode a current source of 300 uA is activated by STBY CNTL(standby control) that turns on M1 when the standby mode is entered. The 300 uA current is directed to the sources of the PMOS pair M2 and M3, and then to the drains of M4 and M5. The gates of M2 and M4 are common as are the gates of M3 and M5. A signal and its complement, that indicate a high or low, drive the gates and the common drains of M2 and M4 connect to one conductor of the transmission cable pair 226 while the drains of M3 and M5 connect to the other conductor of the pair. M6 and M7 provide a return path for the current.

The CMOS data word or clock signal to be serialized and sent is shown as IN 221. That signal is input to a CMOS to differential CML circuit 220 that converts the CMOS signal from the serializer/deserializer 90 to the CML differential signal that is placed on the transmission line 94.

Figure 9B:
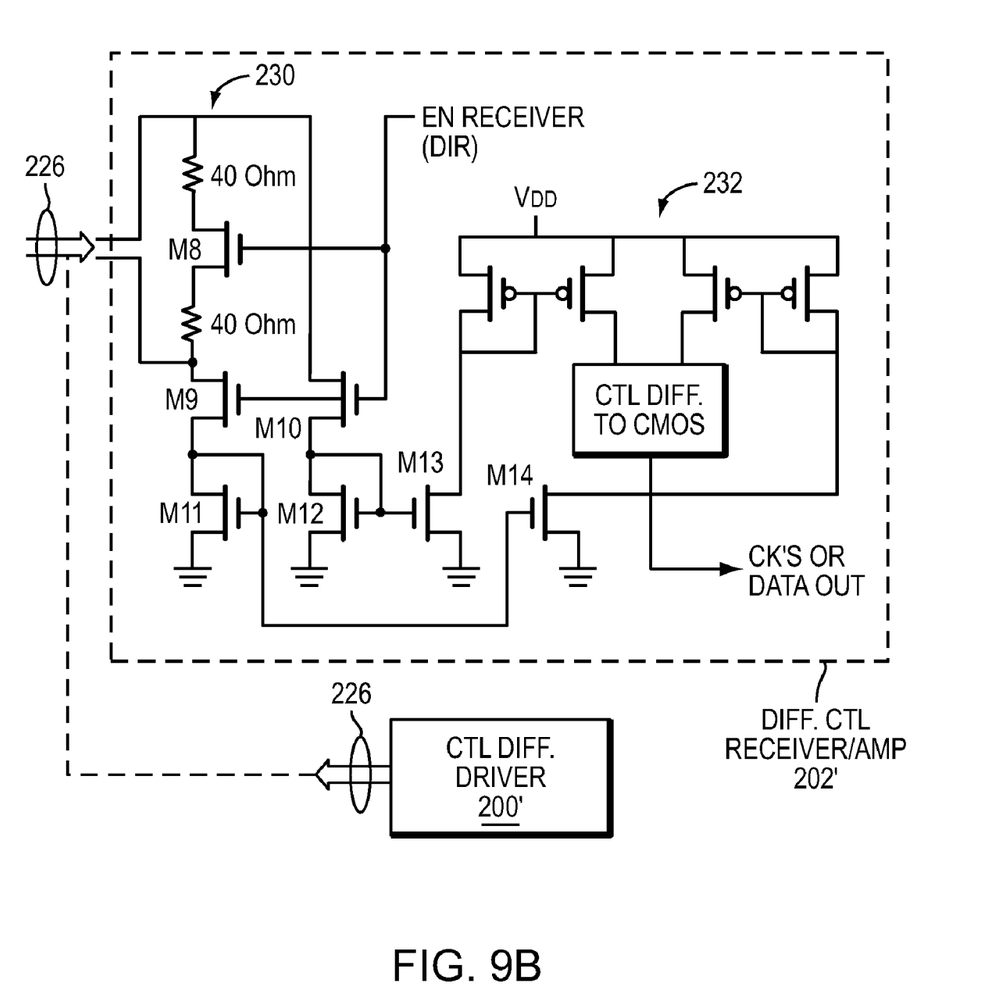

FIG. 9B is an illustrative receiver of the differential cable pair 94. When receiving, EN RECEIVER 228 (from the direction control) is true turning on M8, M9 and M10 and connecting the two series 40 ohm resistors 230 across the cable 226 conductors to match the cable's characteristic impedance. The received current signal is input via current mirrors M11/M14 and M12/M13 for amplification by the differential circuit 232. The output of 232 is converted back into CMOS signals the converter 240.

The circuits and operation of FIGS. 9A and 9B applies to the sending and receiving of both the data and the clock signals. On one side of the cable 94, there is a driver 200 and a receiver 202 and identical circuits 200' and 202' at the other end of the cable 94.

Figure 10:
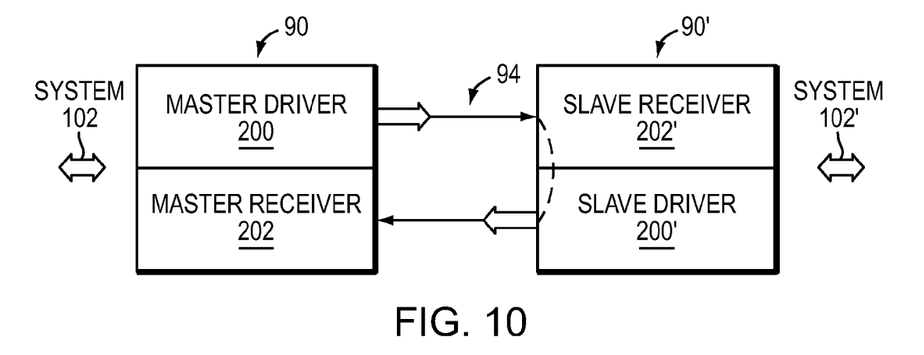
FIG. 10 is an illustrative block diagram showing a master/slave embodiment of the invention.

FIG. 9A has two inputs STBY CNTL and BURST CNTL from the control logic 110. When BURST CNTL is true the current source is added to the current through M2 and M3. The higher current provide for faster driver operation and dissipates more power. As shown the 300 uA current source may be disabled, but in other application the higher current simply provides additional current and the 300 uA would remain always on. In addition an additional current source 252 may be provided in the drain of M7 to further improve speed of operation In one illustration the present invention may be arranged in a master/slave configuration as illustrated in FIG. 10. Here the master driver 200 can receive a parallel data word from the system 102 and output serial control information and data to the slave 202'. The control information programs the slave to act in prescribed manner. For example, the master may direct the slave to read data from the system 102' and send it to the master 90. In such an instance the slave system 90' may use its own clock to send the data to the master, but the arrangement allows the master to transfer its clock to the slave and have the slave use the master's clock to send the data back to the master. That is the slave accepts the master's clock from the cable 94 and uses that clock to output the data from the system 202' back to the master. It may be advantageous to have the master receiving data that is timed with the master's own clock signal.

In the system of FIG. 10, either the master or the slave may be able to turn around the bi-directional differential data and clock lines 94. The master has the ability, as mentioned above, to program the slave so that the slave knows that the master wants to send data to the slave or have the slave gather and send data to the master. Both the master and the slave have oscillators, and both have the fast CML drivers and the ability to go into the low power standby mode, but quickly go to full power drivers. The oscillators in the master and the slave may be turned off independently.

Figure 11:
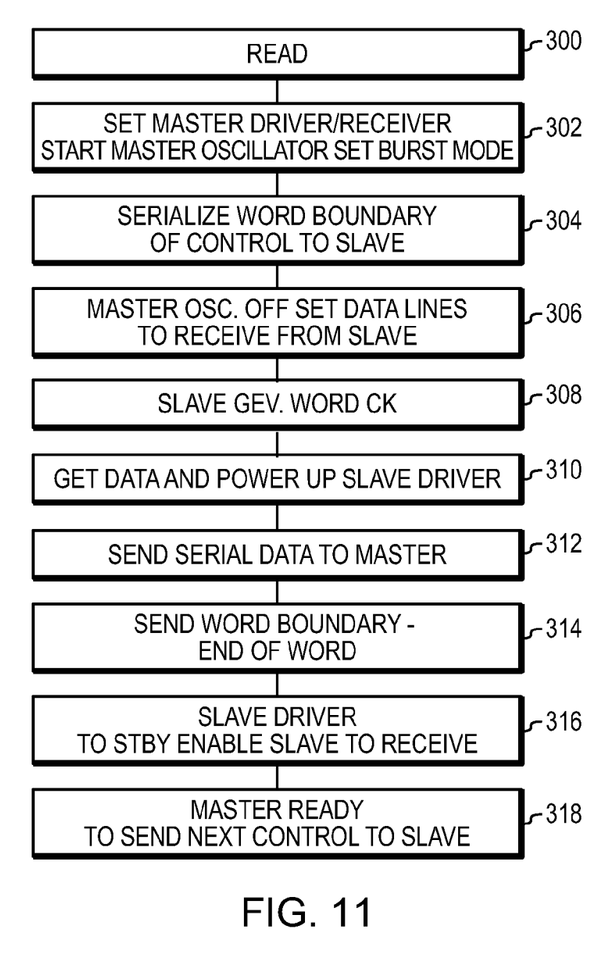
FIG. 11 is a flow chart illustrating a master/slave read operation.
Figure 12:
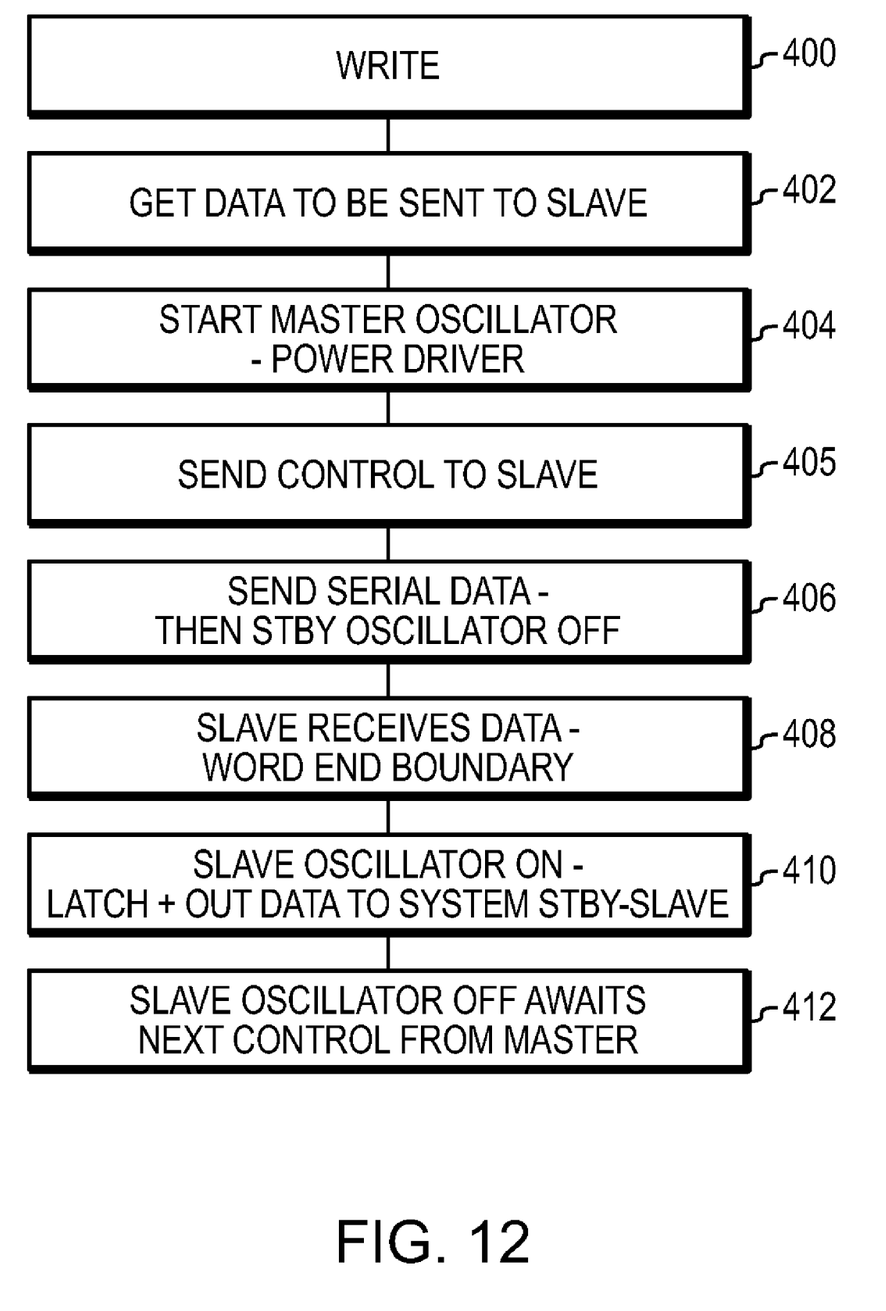
FIG. 12 is a flow chart illustrating a master/slave write operation.

FIG. 11 illustrates a flow chart where the master reads data from a system 102' connected to the slave. FIG. 12 illustrates the master writing data to the slave for delivery to the system 102'.

In the FIG. 11, READ 300, the master starts its oscillator and sets itself to the high power or burst mode 302. The master then send a control word 304 with a word boundary to the slave, and the master turns off its oscillator, sets the data and clock lines to receive and goes into the low power standby mode 306.

The slave turns on its oscillator 308 gets the data word to be sent from the system connected to the slave and comes out of the standby mode 310, and sends the data word to the master 312. The word sent ends with a word boundary 314 indicator, and the slave turns itself around to receive data and clock signals from the master 316 awaiting the next instruction from the master 318.

In the WRITE 400, FIG. 12, the master gets data 402 from the system connected to the master, turns on its oscillator and comes out of standby mode 404. The master may send 405 control information to the slave alerting the slave to the immanent arrival of a data word. The slave turns on its oscillator, and the master sends 406 the data word to the deserializer that delivers 408 it to the system connected to the slave. The slave turns off its oscillator 412 and awaits for the master to act.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A serializer comprising:
    an oscillator outputting clock pulses,
    logic circuitry that accepts data words comprised of data bits received from a system connected to the serializer;
    word boundary logic circuitry that frames the data bits with framing bits;
    wherein the oscillator runs and presents the framed data bits serially to a driver, wherein the driver accepts each frame and data bit and drives a transmission line, wherein the driver defines a low power standby mode and a high power burst mode; and wherein only when a framed data word is being sent the driver is placed into the high power burst mode; and wherein the framed data word is sent faster than the system outputs successive data words;
    a controller that determines when the framed word has been sent and then places the driver into the low power standby mode.

2. The serializer of claim 1 wherein the oscillator is stopped when the driver is placed in the standby mode.

3. The serializer of claim 1 wherein the driver is a differential current logic driver.

4. The serializer of claim 3 wherein the driver comprising a CMOS logic to differential current logic converter that converts a single ended logic signal to a differential signal.

5. The serializer of claim 3 wherein the differential current logic driver comprises two NMOSs with common sources stacked below two PMOSs with common drains, wherein the drain of each NMOS is tied to the source of one PMOS, and where the gate of the NMOS and the gate of the PMOS whose source connects to the NMOS drain are tied together and tied to one of the outputs of the CMOS logic to differential logic converter, and where the gates of the remaining NMOS and PMOS are tied together and to the other output of the CMOS logic to differential logic converter, and wherein the drains of the PMOS are connected to at least one current source that is enabled when in the high power burst mode and disabled when in the low power standby mode.

6. The serializer of claim 1 further comprising:
    logic circuitry that accepts control data from the system connected to the serializer.

7. The serializer of claim 1 wherein the transmission line comprises two transmission lines, one carrying word data bits and the other carrying clock pulses, and further comprising a second driver that outputs a clock pulse when the driver outputs a word data bit, wherein the clock pulse indicates when the word data bit may be received.

8. A serializer/deserializer comprising a serializer of claim 1 and further comprising a deserializer, the deserializer comprising
    a receiver connected to the distal end of the transmission line;
    logic circuitry that accepts each bit from the transmission line;
    deserializing circuitry that takes each bit from the logic circuitry, detects the word boundary and present the received data word to a system connected to the deserializer; and
    control circuitry that conditions the deserializer to respond to control signals.

9. A serializer/deserializer system as in claim 8 further comprising a second serializer/deserializer as in claim 8, the second serializer/deserializer comprising a deserializer at the adjacent end of the transmission line and a serializer at the distal end of the transmission line.

10. The serializer/deserializer of claim 9 wherein the serializer and the deserializer at the adjacent or at the distal end of the transmission line can either can send or receive data on the transmission line.

11. The serializer/deserializer of claim 9 wherein the serializer and deserializer at the adjacent end of the transmission line comprise a master and the serializer and deserializer at the distal end of the transmission line comprise a slave, and wherein the transmission line comprises two differential pairs, one pair carrying serial word data bits and the other pair carrying timing pulses.

12. The serializer/deserializer of claim 11 wherein the master can send control information to the slave.

13. The serializer/deserializer of claim 12 wherein the master can control the slave to use the clock signal received from the master and use that clock to place the word data bits onto the word data carrying transmission line.

14. A method for serializing data, the method comprising the steps of:

outputting clock pulses, accepting data words comprised of data bits in from a system connected to the serializer;

framing the data word, wherein the framing comprises framing bits;

outputting a framing or a data bit with each clock pulse, wherein the clock pulses are arranged to output a framed data word faster than the system outputs successive data words;

driving a transmission line with each framing or data bit, wherein the driver defines a low power standby mode when not driving the transmission line and a high power burst mode when driving the transmission line; and determining that the framed data word has been sent, and then placing the driver into the low power standby mode.

15. The method of claim 14 further comprising the step of stopping the oscillator when the driver is placed in the standby mode.

16. The method of claim 14 wherein the step of driving the transmission line comprises the steps of differentially current driving the transmission line.

17. The method of claim 16 wherein the step of driving comprises the step of converting single ended CMOS logic signals to differential current logic signals suitable for driving a differential transmission line pair.

18. The method of claim 14 further comprising:

sending control information from the system connected to the serializer.

19. The method for serializing of claim 18 further comprising the steps of sending serial data from the distal end of the transmission line to the adjacent end, and receiving the serial data from the distal end and deserializing the data at the adjacent end of the transmission line.

20. The method of claim 19 wherein the serializer or the deserializer at the adjacent or at the distal end of the transmission line can either can send or receive on the transmission line.

21. The method of claim 19 further comprising the steps of:

arranging in the serializer and deserializer at the adjacent end of the transmission line to be a master; and arranging the serializer and deserializer at the distal end of the transmission line to be a slave, and wherein the transmission line comprises two differential pairs, one pair carrying serial word data bits and the other pair carrying timing pulses.

22. The method of claim 21 further comprising the step of the master sending control information to the slave.

23. The method of claim 22 further comprising the master sending control information to the slave, wherein the slave receives the clock signal from the master and uses that clock for placing the word data bits onto the word data carrying transmission line, and sending that clock back to the master on the clock carrying transmission line.

24. The method of claim 14 further comprising the steps of sending data word bits on one transmission line pair and sending clock pulses on wherein the transmission line comprises two transmission lines, one carrying word data bits and the other carrying clock pulses, and further comprising a second driver that accepts the clock pulses and outputs a clock pulse when the driver outputs a word data bit, wherein the clock pulse indicates when the word data bit may be received.

25. A method for serializing and deserializing data, the method comprising the method of claim 14 and further comprising the steps of:

receiving control information to programming a system at the distal end of the transmission line to receive serial data bits;

receiving the serial data bits;

deserializing the word data bits;

detecting word boundaries and presenting the received data word to a system connected to the deserializer.

* * * * *